United States Patent
Huang et al.

(10) Patent No.: US 8,910,018 B2
(45) Date of Patent: Dec. 9, 2014

(54) MEMORY WITH DYNAMIC ERROR DETECTION AND CORRECTION

(75) Inventors: Shih-Chang Huang, Penghu (TW); Han-Sung Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 108 days.

(21) Appl. No.: 13/551,485

(22) Filed: Jul. 17, 2012

(65) Prior Publication Data
US 2014/0026011 A1 Jan. 23, 2014

(51) Int. Cl.
*G11C 29/00* (2006.01)
(52) U.S. Cl.
USPC .......................................... 714/763; 714/758
(58) Field of Classification Search
CPC .................................................. G06F 11/1076
USPC ................... 714/763, 711, 758, 30
See application file for complete search history.

(56) References Cited

U.S. PATENT DOCUMENTS

| | | | |
|---|---|---|---|
| 5,046,046 A | 9/1991 | Sweha et al. | |
| 5,630,093 A * | 5/1997 | Holzhammer et al. | 711/115 |
| 7,196,952 B1 | 3/2007 | Trinh | |
| 7,334,159 B1 * | 2/2008 | Callaghan | 714/30 |
| 7,557,147 B2 * | 7/2009 | Martinez et al. | 521/144 |
| 8,120,960 B2 * | 2/2012 | Varkony | 365/185.16 |
| 8,223,563 B2 * | 7/2012 | Kozakai et al. | 365/189.09 |
| 8,402,326 B2 * | 3/2013 | Singh | 714/711 |
| 2010/0107037 A1 | 4/2010 | Pelley, III et al. | |

* cited by examiner

*Primary Examiner* — Fritz Alphonse
(74) *Attorney, Agent, or Firm* — Yiding Wu; Haynes Beffel & Wolfeld LLP

(57) ABSTRACT

A dynamic error correcting table can be embedded on an integrated circuit memory device. The error correcting table includes entries which are created for data when an error is detected and corrected during a read of the data. During subsequent reads, without intervening write or refresh operations, the entry in the table can be used to correct the error by merging the corrected bit with the data output from the array before it is applied to the ECC logic.

20 Claims, 6 Drawing Sheets

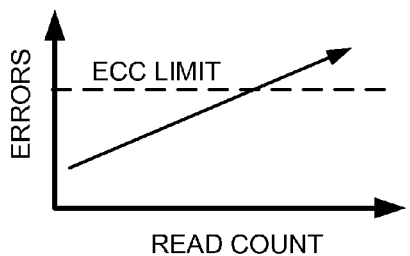
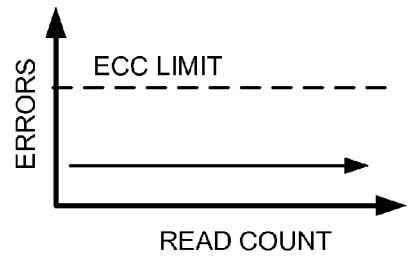
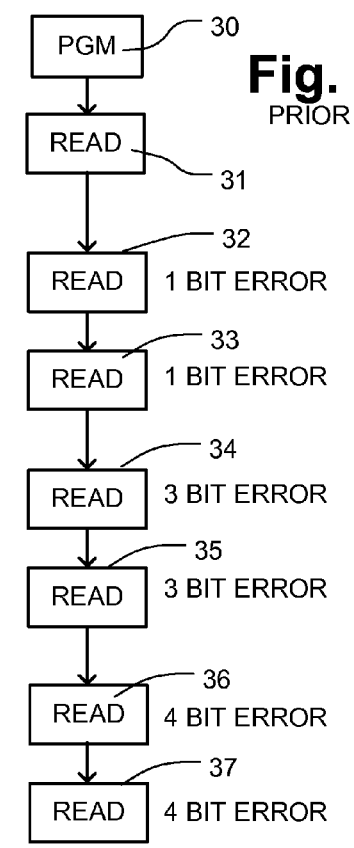
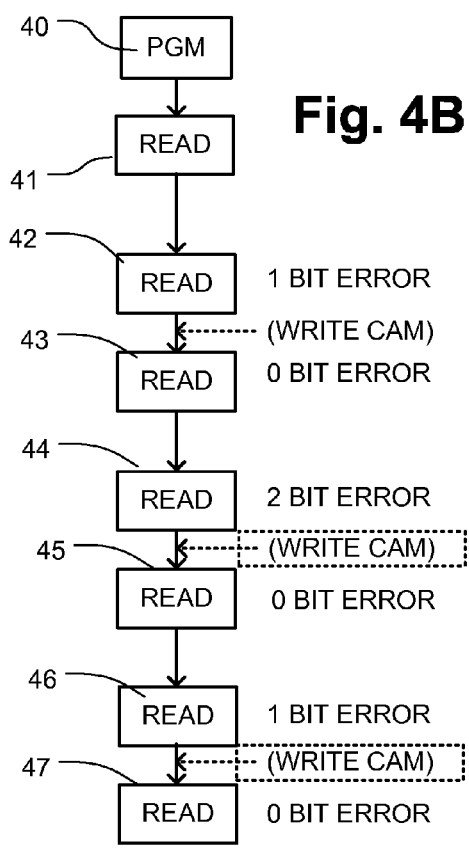

MEMORY WITH DYNAMIC ERROR DETECTION AND CORRECTION

BACKGROUND

1. Field of the Invention

The present invention relates to memory devices and systems including error correction code logic.

2. Description of Related Art

Memory technologies used for integrated circuit memories are being developed at smaller and smaller technology nodes, and are being deployed on larger and larger memory arrays on a single integrated circuit. As the technology for memory cells advances, the margins for sensing the data can become tighter. Also, the ability of the memory cells to hold data values in the presence of disturbance of the memory cell state caused by high speed and high volume accesses to the memory cells and to neighboring memory cells can be limited by the tighter margins.

To address issues like those that arise from tighter margins and memory cell disturbance, as these technologies scale in size and density, use of error correcting codes (ECC) embedded with integrated circuit memory has become more widespread. Hamming codes are one known type of ECC, and in common forms can provide for single bit error correction and detection of two bit errors in the protected data. Single bit correction may not be sufficient for some memory technologies. In this case, multibit ECC technologies such as BCH codes can be applied. However, utilizing BCH codes can involve significant hardware overhead, and remains limited in the scope of error correction possible.

It is desirable to improve the performance of ECC technologies, while limiting the hardware overhead needed on integrated circuits in which such technologies are applied.

SUMMARY

Performance of ECC technologies is improved as described herein, using an error correcting table, which can be embedded on an integrated circuit memory device. The error correcting table includes entries which are created for data when an error is detected and corrected during a read of the data. During subsequent reads, without intervening write or refresh operations, the entry in the table can be used to correct the error by merging the corrected bit with the data output from the array before it is applied to ECC logic in which the ECC is applied to the corresponding data to produce error checked data.

The error correcting table can be referred to as a "dynamic" error correcting table because it is used to temporarily correct errors in data protected by an ECC which might occur between write or refresh operations for the data. Also, the table is "dynamic" because it is updated automatically during sequential reads of data between write or refresh operations. Using the error correcting table, errors that can accumulate because of "read disturb" which causes degradation of the memory cell state because of the repeated biasing for read operations, for example, can be tracked and corrected.

Other aspects and advantages of the present technology can be seen on review of the drawings, the detailed description and the claims, which follow.

BRIEF DESCRIPTION OF THE DRAWINGS

FIG. 3A is a graph illustrating how an ECC limit can be exceeded during sequential reads of data, according to prior art.

FIG. 3B illustrates sequential reads after a program operation, during which errors accumulate which cannot be corrected.

FIG. 4A is a graph illustrating that a process as described herein can prevent a system from exceeding the ECC limit during sequential reads.

FIG. 4B illustrates sequential reads after a program operation, utilizing an error correcting table as described herein to prevent the system from exceeding the ECC limit.

DETAILED DESCRIPTION

A detailed description of embodiments of the present invention is provided with reference to the FIGS. 1-10.

Figure 1:
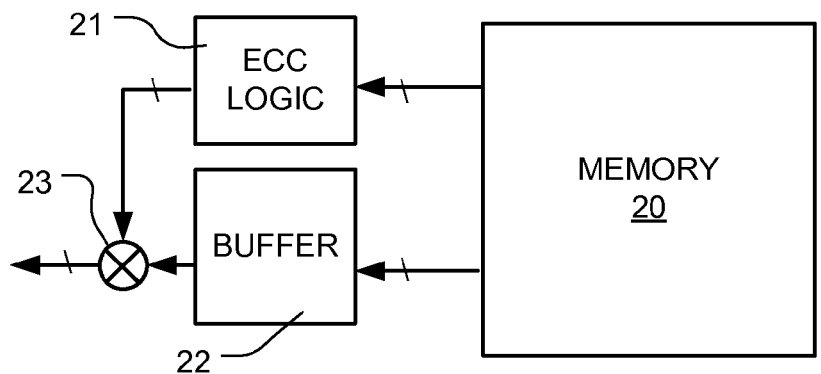
FIG. 1 is a simplified diagram illustrating the combination of ECC logic with a memory system during a read.
Figure 2:
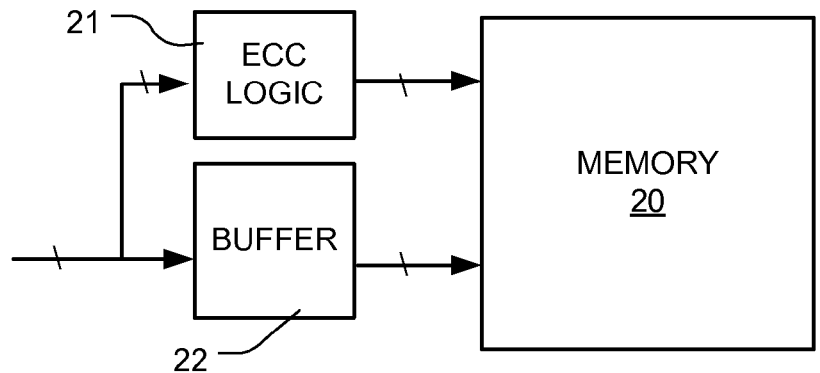
FIG. 2 is a simplified diagram illustrating the combination of ECC logic with a memory system during a write.

FIGS. 1 and 2 illustrate basic ECC logic structures which have been applied in memory systems. FIG. 1 shows a memory 20, which can be an integrated circuit memory with ECC logic for data flow corresponding to a read operation. During a read operation addressing data in the memory 20, the addressed data is delivered to a buffer 22 and to ECC logic 21, while the ECC associated with the addressed data is delivered to ECC logic 21. The addressed data can include a data set, such as a page or other multiple byte set of data, and the ECC is computed over the data set. The ECC logic 21 determines whether the addressed data contains one or more errors, and whether the detected one or more errors can be corrected. The number of errors and whether the errors can be corrected in the error checked data in a given implementation depends on the type of ECC utilized. If the error can be corrected, then the corrected data from the ECC logic 21 is combined with the data from the addressed data in the buffer 22 with logic 23 that merges the corrected data with the data in the addressed data. Then the error checked block, with any corrections that have been merged into the block, is provided as output.

FIG. 2 shows the memory 20 for a data flow corresponding to a write operation. During a write operation addressing a block in the memory, the data to be written is delivered to the buffer 22. Typically in parallel, ECC logic 21 computes an ECC to be stored in association with the data. The data from the buffer 22 and the ECC from the ECC logic 21 are stored in the memory 20.

The ECC logic 21 and the buffer 22 illustrated in FIGS. 1 and 2 can be implemented in a variety of configurations in a memory system. For example, the ECC logic 21 and the buffer 22 can be implemented using the operating system of a host processor. Also, the ECC logic 21 and the buffer 22 can be implemented in a memory controller device which is used to control the memory 20, typically along with a set of other memory devices. In other embodiments, the ECC logic 21 and the buffer 22 can be embedded on an integrated circuit with a memory array.

FIG. 3A is a graph showing the performance of ECC systems like that of FIG. 1 and FIG. 2, in the situation in which data is written once, and read many times, before being refreshed or overwritten with new data. For this situation, the read count is reflected along the horizontal axis, and the number of errors in the block for the given read is reflected on the vertical axis. As mentioned above, in many modern memory technologies, read operations can disturb the data stored in the addressed memory cells, or the data can otherwise accumulate errors over time because of other sources of disturbance or other characteristics of the memory cell technology. The graph in FIG. 3A illustrates that, as the sequence of reads progresses, the number of errors detected in the addressed data can reach the limit for the ECC logic associated with the addressed data. If this limit is reached in the deployment of a memory system, then the memory is unreliable.

FIG. 3B is a simplified illustration of the problem of accumulating errors during multiple reads. In FIG. 3B, the sequence begins with a program operation 30 (or write operation). Next, the data written during the program operation is subject of a read operation 31. This is followed by a sequence of read operations 32, 33, 34, 35, 36, 37 distributed over time with random intervals in between. In this example, during read 32 a single bit error is detected. The ECC logic is capable of correcting that error and good data can be delivered to the host. In a following read 33, that same single bit error is detected. Sometime later, the next read 34 encounters a three bit error, which can include the original single bit error combined with two additional errors. The ECC logic may be able to correct the three bit error if it had been implemented with enough depth, or the limit of the ECC logic may have been exceeded. FIG. 3B shows a next read 35 which encounters the same three bit error. Sometime later, a following read 36 encounters a four bit error, which can be caused by only one additional bit error in the data, combined with the three previously detected errors. Likewise, a subsequent read 37 encounters the same four bit error. Thus, FIG. 3B illustrates the accumulation of errors during a sequence of reads, as illustrated by the graph in FIG. 3A.

FIG. 4A is a graph like that shown in FIG. 3A illustrating, however, a result which is possible using the technology described herein. In particular, a sequence of reads following a program, without an intervening refresh or overwriting of the data can continue indefinitely without accumulating errors to the point that the ECC limit is exceeded.

FIG. 4B is an illustration in the form of, and for comparison with, FIG. 3B. FIG. 4B shows results that can be achieved using the present technology in a sequence of reads that encounter the same bit error conditions as discussed with respect to FIG. 3B. The sequence begins with a program operation 40, followed by a first read 41. This is followed by a sequence of read operations 42, 43, 44, 45, 46, 47. In this example, during read 42, a single bit error is detected at the ECC logic. The ECC logic is capable of correcting that error, and good data is supplied. Also an error correcting table as described in more detail below, implemented for example using content addressable memory (CAM), is written with an entry including the address of the addressed data, and identifying the detected error. In the next read 43, the error correcting table is used to correct the previously detected error before it is applied to the ECC logic. Thus, during the second read 43, zero bit errors are detected at the ECC logic. In the following read 44, two bit errors are detected which can be different than the error already corrected using the error correcting table. The ECC logic can be used to correct the two bit error in this example and two new entries are created the table for the newly detected errors. During a following read 45, because the errors are corrected using the error correcting table, zero bit errors are detected at the ECC logic. Finally, in the read 46, a single bit error is detected. That error can be corrected using the ECC logic and an entry created in the error correcting table. In a following read 47, zero bit errors are detected. Thus, a sequence of reads can continue indefinitely without exceeding the ECC limit, even as new errors are encountered using the technology described herein.

Figure 5:
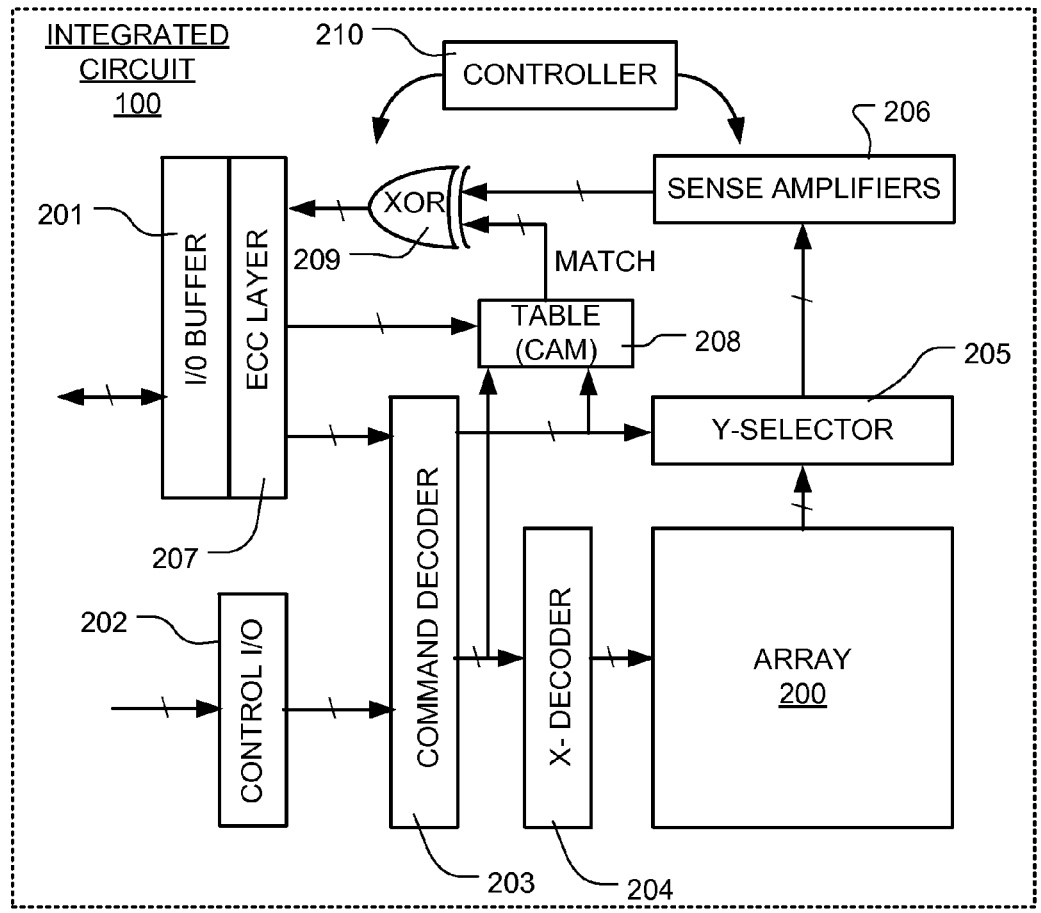
FIG. 5 is a block diagram of an integrated circuit memory employing an error correcting table as described herein.

FIG. 5 is a block diagram of an integrated circuit 100 employing an error correcting table as mentioned above. The integrated circuit 100 includes a memory array 200. An input/output buffer 201 includes circuits that receive and transmit data and address signals in communication with external devices such as memory controllers or host processors. A control input/output block 202 includes circuits that receive and transmit control signals in communication with external devices, including such control signals as chip enable signals, write enable signals, clock signals and so on. A command decoder 203 is coupled to the input/output buffer 201 and the control input/output block 202, which detects and causes execution of commands for operating the memory, including read commands and write commands. Write commands are called, or can include, program and erase commands in some technologies. The command decoder 203 is in turn coupled with a row decoder 204 and a column selector 205 for access to the memory array 200. Sense amplifiers 206 are coupled to the memory array 200 via the column selector 205. The controller 210 is implemented on the integrated circuit 100 as well.

The controller 210 can include one or more state machines, register files, and other logic circuitry that are deployed to execute the functions of the memory, including the read and write functions. The controller 210 can be implemented using one or more dedicated logic circuits, programmable gate array circuits, a programmable processor with associated software, or combinations of these types of circuits. In some implementations, parts of the controller functionality can be implemented off of the integrated circuit 100, in hardware or software associated with the memory controller or a host processor for example.

The integrated circuit 100 also includes an ECC layer 207, illustrated as coupled with the input/output buffer 201 in this example. The ECC layer 207 includes ECC logic and an ECC buffer as illustrated in FIGS. 1 and 2, and provides an embedded ECC logic for the integrated circuit. It is noted that in some implementations, the parts of the functionality of the ECC layer 207 can be implemented off of the integrated circuit 100, in hardware or software associated with the memory controller or a host processor for example.

An error correcting table 208 is included on the integrated circuit 100. An error correcting table 208 is implemented in this example using content addressable memory (CAM). Inputs to the table 208 include the address of an address block, including the row address and the column address which are output by the command decoder 203 in this example. Also, inputs to the table 208 include a bit address from the ECC layer 207 for a detected and corrected error in an addressed data. The output of the error correcting table 208 is a match signal applied as one input to logic, symbolized using an exclusive-OR gate 209 in this diagram, that merges corrected errors from the error correcting table 208 with the data provided by the sense amplifiers 206, thereby dynamically correcting an error in the addressed data which has a corresponding entry in the table 208.

In one example implementation, each sense amplifier in the set of sense amplifiers 206 can be associated with a particular bit address in an addressed data. The table 208 can be segmented logically or physically, and thereby include segments that correspond to each of the sense amplifiers. The table 208 can be configured as well to deliver match signals for each segment. An exclusive-OR gate can be associated with each sense amplifier, which is coupled to the corresponding match signal from the table. In other examples, the addressed data from the sense amplifiers 206 can be delivered in order through the merging logic, which applies the bit correction at the appropriate bit address.

Figure 6:
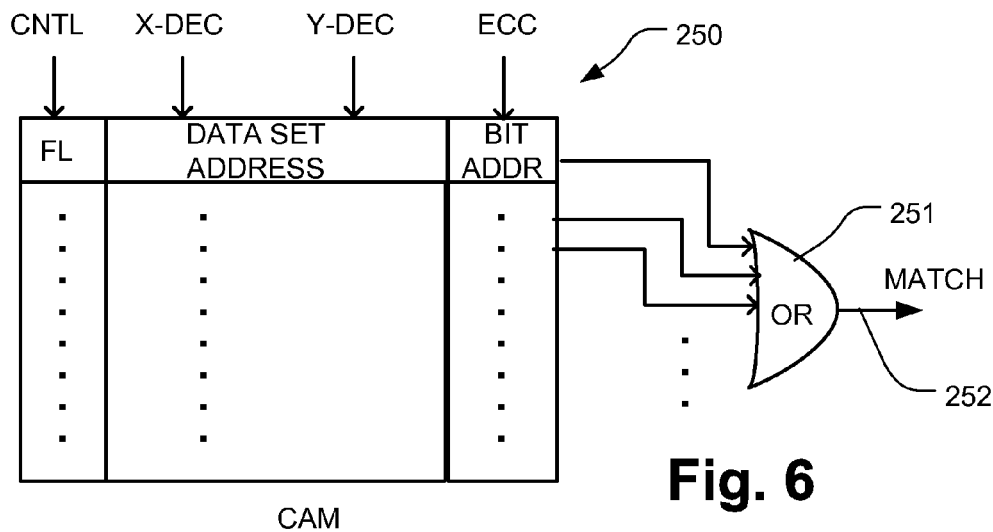
FIG. 6 illustrates the data structure stored in a CAM which implements an error correcting table as described herein.

FIG. 6 illustrates a configuration of the error correcting table 250, stored using a CAM. The table shown in FIG. 6 includes a plurality of entries. The table 250 is a data structure stored in a CAM, so that the inputs are compared to the contents of each entry, and logically matched outputs from each entry are OR'ed, as indicated by symbol 251, to provide a MATCH signal on line 252. Each entry in the table includes a "valid/invalid" flag FL, which indicates whether the corresponding entry is being used and is currently valid or not. The flag FL is set by logic in the controller 210, or by other logic circuits on the integrated circuit during creation of an entry in the table. Each entry in the table includes a data address, which in this example is comprised of the row address and column address for each addressed data set. The data address can be supplied for each entry, under control of the logic in the controller, or other logic circuitry, using data stored in a register in the command decoder 203, or in registers in the row decoder 204 and the column selector 205. Also, each entry in the table includes a bit address identifying the error to be corrected using the entry. The bit address can be supplied, upon detection of the error, by the ECC logic in the ECC layer 207 of the device.

The table 208 can include more than one at entry for each block address, allowing for correction of multiple bits during a sequence of reads. The size of the table can be determined during design of the integrated circuit as a trade-off between the cost of implementation of the table, which can increase with the size of the table, and the error rate performance (e.g., bit error rate BER) characteristics desired for the device.

The table can include fewer entries than there are bits in a column of data in the array served by a particular sense amplifier. Thus, the situation may occur in which the table overruns. In this case, the controller 210 can include logic to determine an entry to be discarded and overwritten by new entries being created. For example, logic in the controller can identify blocks of data (e.g., pages) that have the largest number of entries for bit errors in the table. The entries associated with those pages can be set invalid. When the entries for a given data are set invalid, the logic in the controller 210 can generate a signal in response to which a refresh of the affected pages can be executed, either immediately or later when the resources are available. Alternatively, the logic in the controller can identify pages that have the fewest number of entries for bit errors in the table. The entries associated with those pages can be set invalid, with the supposition that subsequent reads of those pages are less likely to occur before they are overwritten, or that the ECC logic is still capable of correcting such errors during subsequent reads.

Figure 7:
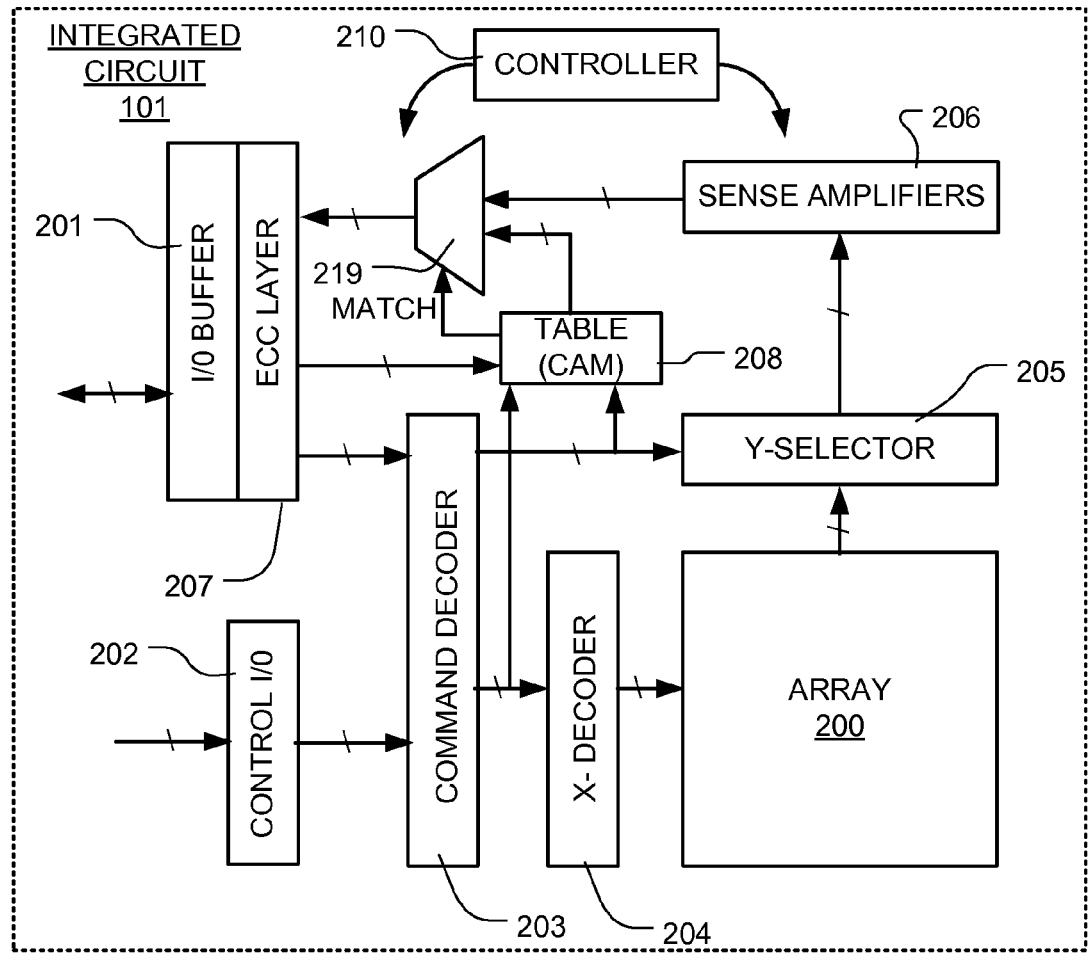
FIG. 7 is a block diagram of an alternative integrated circuit memory employing an error correcting table as described herein.

FIG. 7 illustrates an integrated circuit 101 like that of FIG. 5, and in which like elements have like reference numerals and are not described again. In the integrated circuit 101, the logic for merging errors to be corrected using the table 208 with the data out read via the sense amplifiers 206 is symbolized using a multiplexer in which the error values from the table 208 are provided as a first input to the multiplexer, and the data from the sense amplifiers 206 is applied to a second input of the multiplexer 219. The MATCH signal from the table 208 is applied as the select input for the multiplexer 219. As with the X-OR embodiment, there may be one multiplexer associated with each sense amplifier in the group of sense amplifiers 206 used for reading out the data. The entries in the table can be logically or physically segmented to provide match signals for each of the multiplexers based on the bit addresses of the errors detected.

Both FIGS. 5 and 7 illustrate embodiments of integrated circuits that include a memory array storing data and ECCs in addressable locations, including data in at least one location determined previously using the ECCs with on-chip ECC logic for example, to have one or more errors; a content addressable memory CAM, including entries storing addresses for the one or more locations of data determined to have one or more errors; and logic, disposed in a data path between the memory array and the ECC logic, to use the CAM to correct an error in addressed data before using the ECC logic.

Figure 8:
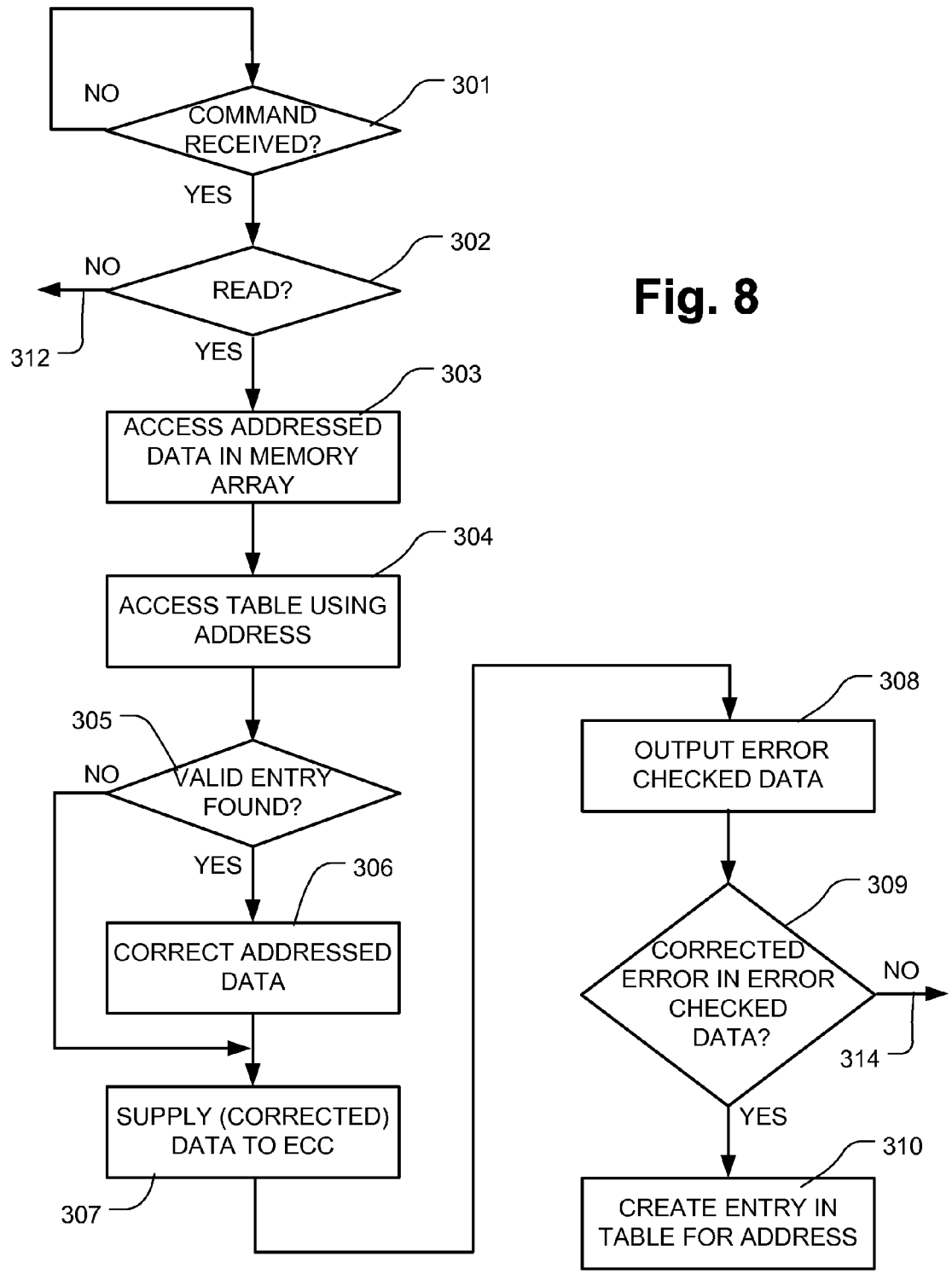
FIG. 8 is a flowchart for functions executed by control logic, associated with a read operation, on an integrated circuit as described herein.

FIG. 8 is a flowchart showing functions associated with a read operation implemented using the logic that can be on the integrated circuit 100, 101, including the logic circuits in the controller 210, a command decoder 203, an ECC layer 207, and so on. A first step includes determining whether a command is received on the integrated circuit (301). The logic circuits wait to receive a command as indicated by the loop. In the next step, the logic determines what type of command has been received (302). For the purposes of this description, if the command is not a read command, then the logic branches to perform other functions (312). If the command is a read command, then the logic causes an access to the addressed data in the memory array (303). Also, the logic causes an access to the error correcting table using the block address (304). The logic determines whether a valid entry is found for the addressed data in the table (305). If a valid entry is determined, then the addressed data is corrected by merging the results from the entry in the table with the accessed data (306). After, or if no valid entry is found at block 305, the logic proceeds to supply the corrected addressed data to the ECC logic (307). The ECC logic then outputs an error checked block, with any correctable errors corrected (308). The logic determines whether there is a corrected error in the error checked block, by receiving a signal from the ECC logic for example (309). If there is a corrected error, then an entry is created in the table for the block address identifying the error (310). If there is no corrected error at block 309, then the logic can branch to perform other functions (314).

Figure 9:
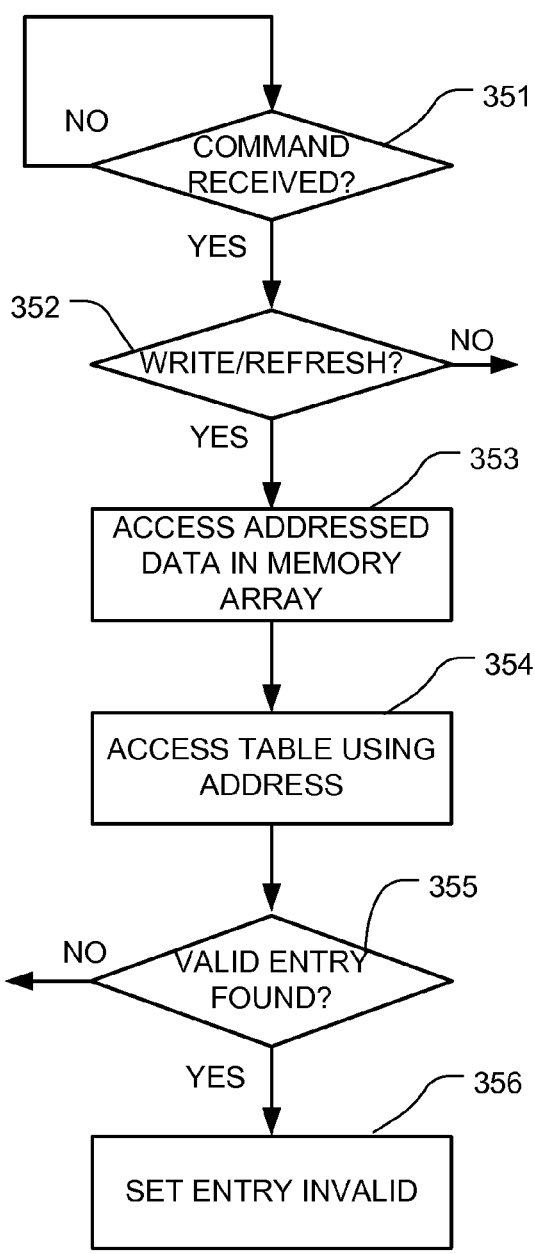
FIG. 9 is a flowchart for functions executed by control logic, associated with a write or refresh operation, on an integrated circuit as described herein.

FIG. 9 is a flowchart showing functions associated with a write or a refresh operation, implemented using the logic that can be on the integrated circuit 100, 101, including the logic circuits in the controller 210, a command decoder 203, an ECC layer 207, and so on. A first step includes determining whether a command is received on the integrated circuit (351). The logic circuits wait to receive a command as indicated by the loop. In the next step, the logic determines what type of command has been received (352). For the purposes of this description, if the command is not a write or a refresh command, then the logic branches to perform other functions. If the command is a write or a refresh command, then the logic causes an access to the addressed data in the memory array (353). Also, the table is accessed using the block address (354). The logic determines whether a valid entry for the block address is found in the table (355). If there is no valid entry for that block address, then the process for managing the table associated with the write or refresh is completed. If there is a valid entry for that block address, then that entry is discarded by setting it invalid or unused, which can be done by resetting the flag FL of FIG. 5 (356). Alternatively, the entry can be discarded by erasing the whole entry, or setting it to a default value.

Figure 10:
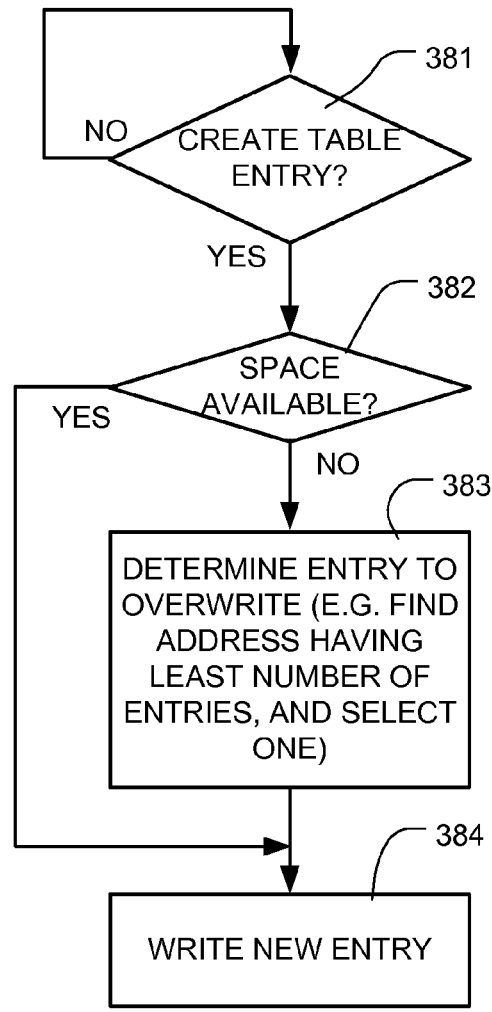
FIG. 10 is a flowchart for functions executed by control logic, used for creating entries in an error correcting table as described herein.

FIG. 10 is a flowchart showing functions associated with creating an entry in the table, implemented using logic on the integrated circuit 100, 101, including the logic circuits in the controller 210, a command decoder 203, an ECC layer 207, and so on. A first step includes determining whether a signal is received to create an entry in the table (381). The logic circuits wait to receive a signal to create a table entry as indicated by the loop. Such a signal can be generated in the ECC layer upon detection and correction of one or more errors in an addressed data. In the next step, the logic circuits determine whether space is available in the table (382). If space is available, then the logic circuits proceed to block 384 and write a new entry. Whether space is available can be determined by scanning the flags FL to determine whether there are any flags indicating an unused entry. If there is no space available, then the logic determines an entry to overwrite (383). One technique for determining an entry to overwrite can include determining a block address having the least number of entries in the table, and selecting one of those entries. One technique for selecting an entry would be to reset the flag of the entry to be overwritten, causing the logic to scan the table once again to find any flag indicating an unused entry.

Technologies have been described which can significantly improve memory reliability using ECC techniques. Furthermore, ECC efficiency is optimized using an error correcting table, which can be implemented using CAM. The hardware overhead associated with these technologies is very small, and can extend to the error correcting capability of ECCs designed to detect and correct only one or a small number of bits in an addressed data. Thus, an ECC designed to correct only single bit faults can be used to correct many faults that occur during a sequence of reads, without intervening write or refresh operations. When the ECC is designed to correct multiple bit faults, the power of the technology described herein is extended further, enabling the correction of very large numbers of errors in sequential reads.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims. What is claimed is:

What is claimed is:

1. A method of operating a memory storing data and error correcting codes (ECCs) in addressable locations, comprising:
   storing entries in a table, the entries identifying errors in the data stored in one or more addressable locations in the memory;
   reading data from a particular addressable location in the memory; and
   using the table to correct an error in the data stored in the particular addressable location, before using the ECC stored with the data.

2. The method of claim 1, wherein the data stored in the particular addressable location comprises a data set including multiple bytes, and the ECC is computed over the data set.

3. The method of claim 1, wherein the table comprises a data structure stored in a content addressable memory.

4. The method of claim 1, including clearing entries in the table for data that are written.

5. The method of claim 1, including refreshing data in the memory, and clearing entries in the table for the refreshed data.

6. The method of claim 1, including:
   after using the table to correct an error in the data, supplying the data and the ECC to ECC logic, and using the ECC logic to provide error checked data.

7. The method of claim 1, including using ECC logic to identify errors in data stored in the memory before said reading, and creating an entry in the table for the identified errors.

8. The method of claim 7, including if the table is full, then overwriting an existing entry with said created entry.

9. The method of claim 8, including selecting said one of the existing entries using parameters determined from the entries in the table.

10. An integrated circuit comprising:
    a memory array storing data and error correcting codes (ECCs) in addressable locations, including data in one or more locations determined to have one or more errors using the ECCs;
    a table memory storing a table including entries for addressable locations determined to store data having one or more errors; and
    logic, executed in a read of a particular addressable location in the memory, to use the table to correct an error in data stored in the particular addressable location before use of the ECC corresponding to the data.

11. The integrated circuit of claim 10, wherein the data stored in the particular addressable location comprises a data set including multiple bytes, and the ECC for the data is computed over the data set.

12. The integrated circuit of claim 10, wherein the table memory comprises a content addressable memory.

13. The integrated circuit of claim 10, including logic to clear entries in the table for data that are written.

14. The integrated circuit of claim 10, including logic that responds to refresh in the memory array to clear entries in the table for refreshed data.

15. The integrated circuit of claim 10, including ECC logic on the integrated circuit, and logic to create entries in the table when errors are identified by the ECC logic.

16. The integrated circuit of claim 10, including
    ECC logic on the integrated circuit, and
    logic to supply the data corrected using the table and the ECC corresponding to the data to the ECC logic, and use the ECC logic to provide an error checked data.

17. The integrated circuit of claim 10, including ECC logic on the integrated circuit, logic to create entries in the table when errors are identified by the ECC logic, and logic to select one of the existing entries for replacement using parameters determined from the entries in the table.

18. The integrated circuit of claim 10, wherein the logic to correct an error using an entry in the table includes an exclusive-OR gate having a first input connected to an output of the table, and a second input connected to an output of a sense amplifier for the array.

19. The integrated circuit of claim 10, wherein the logic to correct an error using an entry in the table includes a multiplexer having a first input connected to an output of the table, a second input connected to an output of a sense amplifier for the array and a select control signal connected to an output of the table.

20. An integrated circuit comprising:
- a memory array storing data and error correcting codes (ECCs) in addressable locations, including data in at least one location determined to have one or more errors using the ECCs;
- a content addressable memory, including entries storing addresses for the one or more locations of said data determined to have one or more errors;
- ECC logic; and
- logic, disposed in a data path between the memory array and the ECC logic, to use the content addressable memory to correct an error in addressed data before using the ECC logic.

* * * * *